United States Patent [19]
Krüger et al.

[11] Patent Number: 4,787,861
[45] Date of Patent: Nov. 29, 1988

[54] RESILIENT CONTACT PIN AND A METHOD OF ITS MANUFACTURE

[75] Inventors: Gustav Krüger; Klaus Giringer, both of Herrenberg; Sven Hinnerwisch, Nufringen, all of Fed. Rep. of Germany

[73] Assignee: Feinmetall GmbH, Herrenberg, Fed. Rep. of Germany

[21] Appl. No.: 64,868

[22] Filed: Jun. 19, 1987

[30] Foreign Application Priority Data

Jun. 23, 1986 [DE] Fed. Rep. of Germany ....... 3620946
Dec. 29, 1986 [DE] Fed. Rep. of Germany ....... 3644643

[51] Int. Cl.$^4$ .............................................. H01R 4/40
[52] U.S. Cl. .................................... 439/482; 439/819
[58] Field of Search ................. 439/289, 482, 819–824

[56] References Cited

U.S. PATENT DOCUMENTS

| 3,435,168 | 3/1969 | Cooney .............................. 439/482 |
| 3,753,103 | 8/1973 | Tetreault ............................ 439/482 |
| 4,636,026 | 1/1987 | Cooney et al. ...................... 439/482 |

Primary Examiner—Joseph H. McGlynn
Attorney, Agent, or Firm—Herbert Dubno

[57] ABSTRACT

A resilient contact pin for contacting electrical or electronic items to be tested, such as conductor plates, printed circuit boards or the like, the resilient contact pin being electrically conductive and intended for mounting on a testing arrangement, includes a straight cylindrical member including a metallic tube constituted by a punched and bent sheet metal part. A contact member includes a piston accommodated in the metallic tube for axial sliding and a frontward end portion projecting out of the metallic tube and serving for contacting the item to be tested. A spring is accommodated in the metallic tube and urges the contact member in a frontward direction relative to the metallic tube. There is further provided at least one lug constituted by an integral region of a circumferential wall of the metallic tube and extending into the interior of the metallic tube to constitute an abutment which limits the extent of the frontward movement of the piston of the contact member.

52 Claims, 3 Drawing Sheets

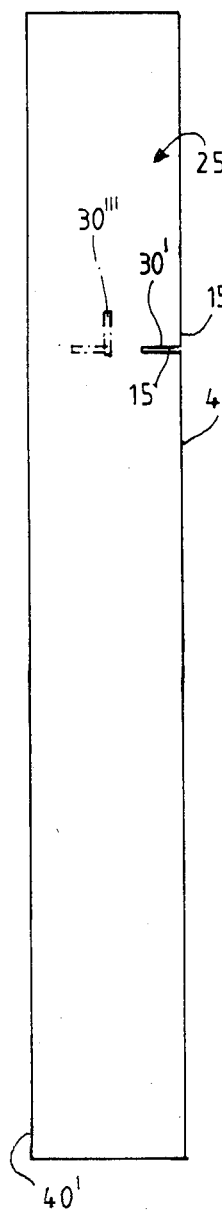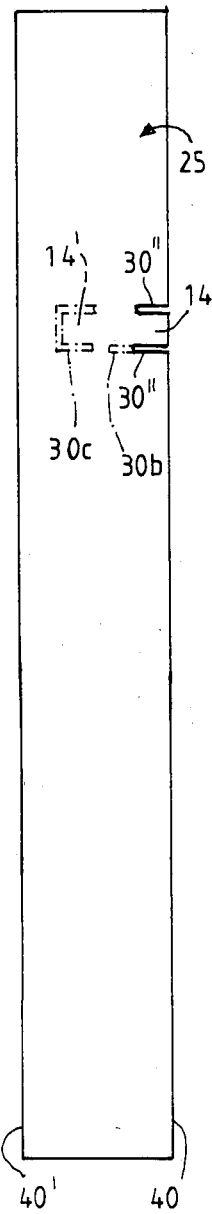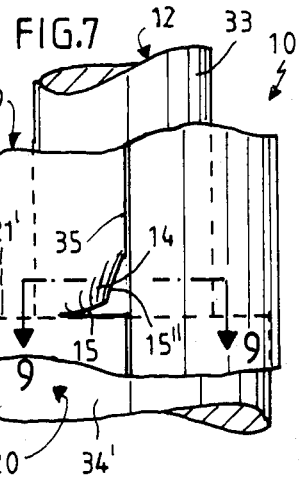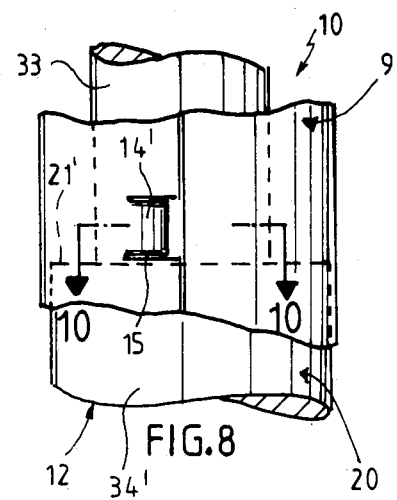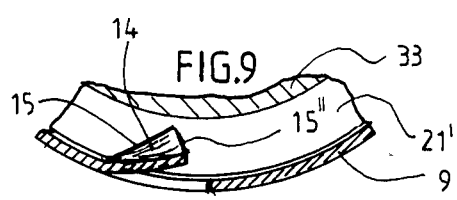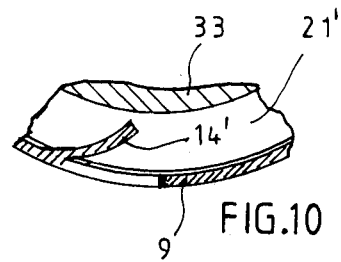

RESILIENT CONTACT PIN AND A METHOD OF ITS MANUFACTURE

FIELD OF THE INVENTION

The present invention relates to resilient contact pins in general, and, more particularly, to contact pins which are suited for use in testing equipment for printed circuit boards and similar items, as well as to a method of manufacturing such contact pins.

BACKGROUND OF THE INVENTION

Testing arrangements of the above type are well known. In general, they include a testing adapter or the like, which is equipped with a multitude of resilient contact pins adapted for contacting the printed circuit board or similar items to be tested. In this context, reference may be made, for instance, to an article by Krüger entitled "Pruefmittel zur Pruefung von Leiter platten fuer Uhren", appearing in the Jahrbuch der Deutschen Gesellschaft fuer Chronometrie, Vol. 30, 1979, pp. 269–276. Especially on page 272, FIG. 3, there is disclosed the construction of resilient contact pins of the type here under consideration. These resilient contact pins are inserted either directly into bores of the testing adapter, or in sleeves which are, in turn, supported in respective bores of the testing adapter. The assembly of such known resilient contact pins was accomplished heretofore in such manner that a spring and a contact member are introduced into the interior of a hollow cylinder member, and then an abutment is formed on the member for determining the frontmost or extended position of the contact member relative to the cylinder member into which a spring accommodated in the cylinder member can press a piston of the contact member. This abutment is formed by an inward swaging of the upper end of the cylinder member or by an inward pressing of an internal annular bulge into the cylinder member. However, such deformations of the cylinder member to form the abutment for the piston of the contact member are difficult to accomplish, because of the extremely small diameter of the cylinder member which amounts in general at most to 2.5 millimeters and usually even to considerably less. Moreover, this subsequent deformation brings about the danger of damage to the cylinder member, especially at the internal sliding surface thereof which serves to slidingly guide the piston of the contact pin. Such damages may result, in the worst case, in the contact pin becoming unusable, or in the best case in a situation where the piston of the contact member will be at least occasionally jammed.

SUMMARY OF THE INVENTION

Accordingly, it is a general object of the present invention to avoid the disadvantages of the prior art.

More particularly, it is an object of the present invention to provide a resilient contact pin which does not possess the drawbacks of the known pins of this type.

Still another object of the present invention is to devise a resilient contact pin of the type here under consideration which can be very rapidly and easily assembled.

It is yet another object of the present invention to design the above pin in such a manner that the heretofore existing danger of damage to the cylinder member is avoided.

A concomitant object of the present invention is so to construct the pin of the above type as to be relatively simple in construction, inexpensive to manufacture, easy to use, and yet reliable in operation.

SUMMARY OF THE INVENTION

In keeping with these objects and others which will become apparent hereafter, one feature of the present invention resides in a resilient contact pin for contacting electrical or electronic items to be tested, such as conductor plates, printed circuit boards or the like, the resilient contact pin being electrically conductive and intended for mounting on a testing arrangement. The pin of the present invention includes a straight cylindrical member including a metallic tube constituted by a punched and bent sheet metal part, a contact member which includes a piston accommodated in the metallic tube for axial sliding and a frontward end portion projecting out of the metallic tube and serving for contacting the item to be tested, a spring that is accommodated in the metallic tube and urges the contact member in a frontward direction relative to the metallic tube, and at least one lug constituted by an integral region of a circumferential wall of the metallic tube and extending into the interior of the metallic tube to constitute an abutment which limits the extent of the frontward movement of the piston of the contact member.

The tube equipped with the lug is structurally very simple and can be produced in an economical manner even when the diameter thereof is very small. Furthermore, even the assembly of the resilient contact pin according to the present invention is extremely simple. It is merely necessary to consecutively introduce the spring means and the piston of the contact member into the interior of the cylinder member and, as the case may be, possibly bend the lug into the interior of the tube. There no longer exists the danger of damage to the tube and particularly its inner sliding surface for the piston, inasmuch as the bending of the lug can be accomplished without encountering any problems. Moreover, there is not even the danger of jamming of the piston any longer, inasmuch as the piston comes into engagement with the lug, preferably with an edge of the lug. Even though it is advantageous when the lug is inwardly bent after the introduction of the piston of the contact member into the cylinder member, and where the lug can be preferably non-elastic, this operating step can be dispensed with and the assembly of the resilient contact pin can be accomplished the more rapidly in that the lug forms an elastically resilient, preferably tongue-shaped back hook which is so arranged that it permits the introduction of the piston into the tube with attendant resilient outward deflection which is caused by the movement of the piston into the tube.

Then, the piston or a region of the piston slides during the introduction of the piston into the tube along the back hook, thus outwardly resiliently displacing the back hook to the needed extent until it passes beyond this back hook, whereafter the back hook again returns into its initial position in which it then constitutes an abutment for the contact member, which prevents the piston of the contact member from moving out of the interior of the cylinder member.

Preferably the piston of the contact member includes an annular shoulder which engages behind the lug in the frontmost position of the contact member.

The spring means which is accommodated in the interior of the cylinder member can be constituted by one or more springs and is preferably prestressed, so that under these circumstances the contact member is pressed against the lug in its non-loaded front rest position. However, it can also be provided that the spring means is so short that it does not press the contact member against the back hook.

BRIEF DESCRIPTION OF THE DRAWING

The present invention will be described below in more detail with reference to the accompanying drawing in which:

FIG. 5 is a view similar to FIG. 4 but showing a modified configuration of the preform;

FIG. 6 is a view similar to FIG. 5 but showing a further modification;

FIG. 7 is a diagrammatic fragmentary side elevational view of a tube made from the preform of FIG. 5;

FIG. 8 is a view similar to FIG. 7 but showing a tube made from the preform of FIG. 6;

FIG. 9 is a partial cross-sectional view taken along the line 9—9 of FIG. 7;

FIG. 10 is a partial cross-sectional view taken along the line 10—10 of FIG. 8;

SPECIFIC DESCRIPTION

Figure 1:
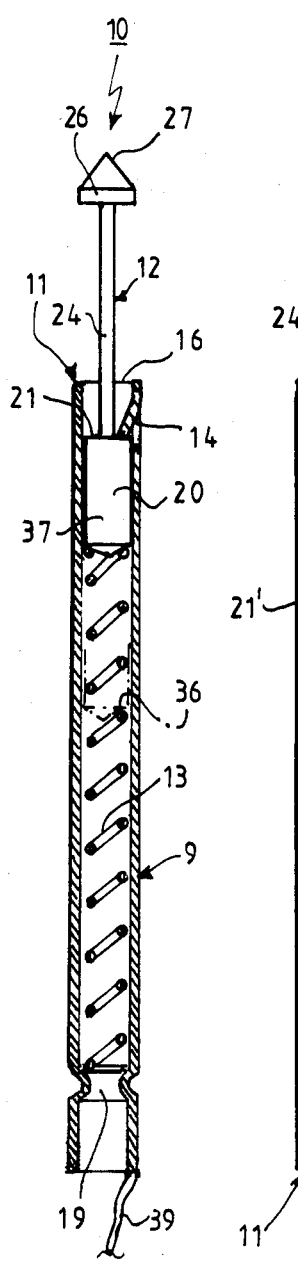
FIG. 1 is a longitudinal sectional view of a resilient contact pin according to the present invention.
Figure 2:
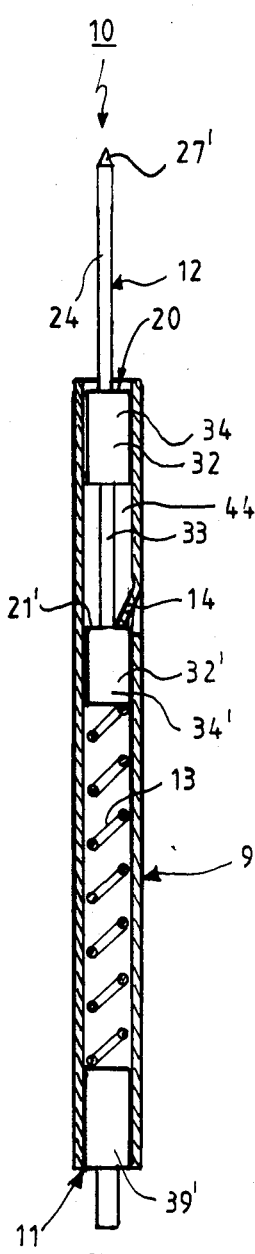
FIG. 2 is a view similar to FIG. 1 but of a modified construction of the resilient contact pin of the present invention.

Referring now to the drawing in detail, and first to FIGS. 1 and 2 thereof, it may be seen that the reference numeral 10 has been used therein to identify a resilient contact pin. The resilient contact pin 10 consists in each instance of a cylinder member 11, a helical compression spring 13 and a contact member 12.

The cylinder member 11 is straight and includes, in the construction of FIG. 1 as well as in that of FIG. 2, a one-piece tube 9 which has a substantially circularly cylindrical circumference. However, a resiliently bendable back hook 14 is formed in the circumferential wall of each of these tubes 9 by punching and bending. The back hook 14 extends into the internal space of the respective tube 9 at an inclination in a direction extending away from a front end 16 of the tube 9 and forms a narrow, rectangular, resilient tongue. This tongue is of one piece with the tube 9 and it extends in the axial direction but obliquely internally in a bent manner. In the proximity of the rear end of the cylinder member 11 which is illustrated in FIG. 1 and which consists of the tube 9, there is provided an internal annular shoulder 19 which extends over the circumference of the aforementioned rear end. A rear end of the helical compression spring 13, which is prestressed, braces itself against the internal annular shoulder 19. The front end of the helical compression spring 12 is centered on a conical rear end of a piston 20 of the contact member 12, so that the spring 12 presses the piston 20 in the frontward direction until an annular front shoulder 21 of the piston 20 abuts the back hook 14 that constitutes an abutment for the front shoulder 21 of the piston 20. The contact member, which is preferably of one piece, is provided, adjacent to the piston 20, with a thinner stem 24 that is coaxial with the piston 20, and a contact head 26 with a diameter exceeding that of the stem 24 mounted on the stem 24 and including a contact tip 27.

Figure 3:
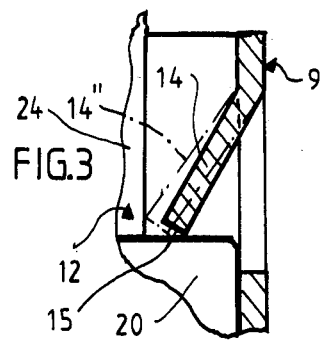
FIG. 3 is a detail of FIG. 1 at an enlarged scale.

The back hook 14 is depicted in FIG. 3 at an enlarged scale.

All parts of the resilient contact pins 10 according to FIGS. 1 and 2 consist of a metal having good electrical conductivity. The contact tip 27 serves for contacting items to be tested, such as conductor plates, printed circuit boards or the like, in order to establish through the respective resilient contact pin 10 an electrical connection between an evaluating device or the like of a testing arrangement and the respective location of the respective item to be tested.

During each individual testing operation, the contact member 12 is moved by the item being tested rearwardly and further into the tube 9 with attendant compression of the helical compression spring 13, for instance, all the way into a position 36 which is indicated in FIG. 1 by dash-dotted lines. Upon the termination of the testing operation, the pressure exerted by the tested item on the contact member 12 is removed again and the contact member 12 returns back into its illustrated initial position by moving in the frontward direction. In this initial position of the contact member 12, the frontward annular shoulder 21 of the piston 20 again abuts against a lower tranvverse edge 15 of the back hook 14 that serves as an abutment.

The tube 9 is made of a punched sheet metal part. This is advantageous from the point of view of cost considering the required small outer diameters of the tubes 9, and it further has the advantage, among others, that the back hook 12 can be produced in a particularly simple manner during the making of the tube 9 by resorting to the use of punching and bending operations.

Figure 4:
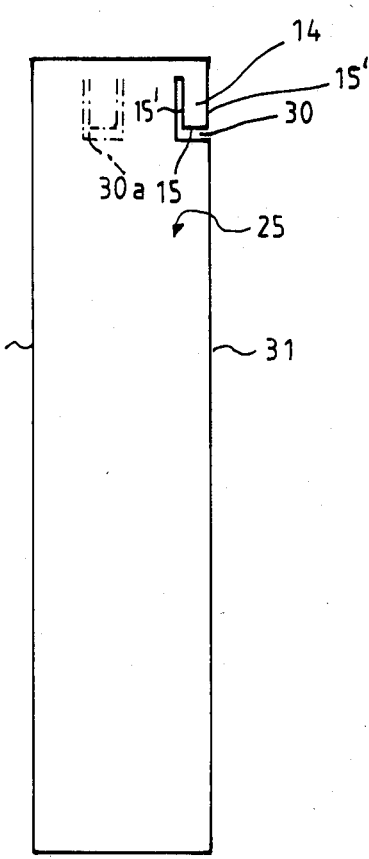
FIG. 4 is a top plan view of a flat preform for the resilient contact pin of FIG. 1.

An embodiment of a preform 25 for the making of the cylinder member 11 of the construction according to FIG. 1 is depicted in FIG. 4 of the drawing in its still flat condition. An L-shaped cutout 30 is provided by punching at one of the longitudinal sides of this rectangular, flat preform 25 to define the tongue-shaped back hook 14. The sheet metal preform 25 may be made of a soft, semi-hard, hard rolled or other sheet metal material, for instance of a resiliently yieldable metal, for example of a phosphorus bronze, or of another more or less elastic or non-elastic metal which may be subjected, if need be, after the bending into the tube 9, at least at the region of the back hook 14 to suitable treatment which imparts resiliently yieldable properties to the affected region. So, for instance, the sheet metal preform 25 may be made of nickel-beryllium, copper-beryllium, steel or the like. However, the sheet metal preform 25 may even be made of other suitable metals, for example of brass or of nickel brass. The tongue which constitutes the back hook 14 is bent into the inclined position which is illustrated in FIG. 1 of the drawing. The preform 25 is then rolled into the tube about its geometric axis that is parallel to the two lateral edges 31 of the preform 25. Upon conclusion of the rolling of the preform 25 into the tube 9, the two longitudinal edges 31 either abut one another, or are spaced from each other by only a minuscule distance.

If the sheet metal preform 25 was already resiliently elastic prior to the bending of the preform 9, the tube 9 can be, if desired or necessary, held together at the edges 31, for instance, by gluing, soldering, welding or the like. It is particularly advantageous to bend the tube 9 from a preform 25 of a metal that is not yet elastic, and only subsequently to give this metal the desired resiliently elastic properties at least at the region of the back hook 14. To this end, the metallic material, such as copper-beryllium or nickel-beryllium can be subjected to a thermal aftertreatment; for instance, the tube 9 can be held, for example in a vacuum, for an extended period of time, at a temperature of about 300° C. Even in this situation, however, the tube 9 can be held together at its interspace between the edges 31, if desired or necessary, by gluing, soldering, welding or the like.

The back hook 14 is bent into the tube interior as illustrated; also, the annular inner shoulder 19 is formed in a chipless operation, for instance by rolling or pressing.

The assembly of the resilient contact pin 10 according to FIG. 1 is accomplished in such a manner that initially the helical spring 13 is introduced into the cylinder member 11, which has been manufactured in the above-described manner, in a direction from the front end 16. During this insertion, the back hook 14 is bent back, if need be. Thereafter, the piston 20 of the contact member 12 is inserted into the cylinder member 11. The piston 20 correspondingly resiliently bends the back hook 14 in the outward direction. Once the piston 20 has moved past the back hook 14, the back hook 14 resiliently moves into the illustrated position thereof in which it extends in an inwardly inclined direction toward the piston 20 in which it now constitutes the abutment for the piston 20 and thus for the contact member 12 that determines the frontward rest position of the contact member 12 relative to the cylinder member 11. The assembly of these three parts of this particular construction of the resilient contact pin 10 can thus be achieved extremely rapidly and simply, even in a fully automated manner. The same applies to the resilient contact pin 10 of the construction depicted in FIG. 2 of the drawing. Thus, the subsequent formation of an abutment for the piston 20 is dispensed with. Instead of a single back hook 14, there may also be provided a plurality of such back hooks 14.

The one-piece contact member 12 of the resilient contact pin 10 according to FIG. 1 is supported in the cylinder member 11 with a sliding bearing play for axial movement by means of a single circularly cylindrical circumferential surface 37 of the piston 20. The exemplary construction of the resilient contact pin 10 that is depicted in FIG. 2 of the drawing differs from that shown in FIG. 1 in that the piston 20 is provided, in order to achieve an even better guidance of the contact member 12 in the tube 9 of the cylinder member 11, with two circularly cylindrical circumferential surfaces 32 and 32' that are spaced from one another in the axial direction of the contact member 12. The circumferential surfaces 32 and 32' are guided in the tube 9 with a sliding bearing play. A cylindrical longitudinal region 33 of the piston of this preferably one-piece contact member 12 is arranged between the circumferential surfaces 32 and 32' and has a considerably smaller diameter than such surfaces 32 and 32'. The tongue-shaped back hook 14 projects into a recess 44 of the piston 20 which is thus provided by respective portions 34 and 34' that carry the sliding surfaces 32 and 32'. In the illustrated frontward rest position of the contact member 12, an annular shoulder 21' of the piston 20 abuts against a free, straight transverse edge 15 of the back hook 14 that further includes two mutually parallel longitudinal edges 15'. Thus, the back hook 14 of this construction includes in all three straight edges 15 and 15' which respectively adjoin one another at right angles The stroke of the contact member 12 during the testing of the items to be tested may advantageously be only so large that no running of the frontward sliding surface 32 of the piston 20 onto the back hook 14 is encountered.

In the embodiment depicted in FIG. 1 of the drawing, the cylinder member 11 consists only of the round tube 9 which also forms the back hook 14 and the inner annular shoulder 19 and is a one-piece part. An electric connection wire 39 is connected to the rear end of the cylinder member 11 and serves as an electrical conductor conductively connected to the pin 12.

In the exemplary embodiment illustrated in FIG. 2 of the drawing, an electrical connection contact pin 39' is firmly inserted into the tube 9 which is circularly cylindrical with the exception of the back hook 14. The contact pin 39, also constitutes a counterbearing for the spring 13. Thus, in this example of the construction of the resilient contact pin 10, the cylinder member 11 consists of a one-piece tube 9 which also forms the back hook 14, and the connecting contact pin 39' which is firmly inserted into the tube 9.

An important advantage of using the back hook 14 is also that the resilient contact pin 10 can again be disassembled without encountering any problems and without causing permanent deformation, for instance, for replacing the spring 13 and/or the contact member 12. To accomplish this, it is merely necessary to bend the back hook 14 back by means of a tool, such as a pin or in FIG. 2 by means of a hook which is placed from the outside onto the back hook 14, to such an extent that the piston 20 is released and, if desired, even the spring 13 can be removed from the interior of the cylinder member 11. In order to be able to pull the back hook 14 from the outside by means of a hook, it is sufficient to make the cutout 30 which delimits the back hook 14 so large below or laterally of the back hook 14 that it is possible to pull the back hook 14 by means of the hook completely therethrough out of the interior of the tube 19. The cutout 30 in the preform 25 according to FIG. 4 is sufficiently large for this purpose.

It can often also be advantageously provided that, for improving the electric conductivity of the resilient contact pin 10, the back hook 14 or at least one back hook 14 of a plurality of such back hooks 14 is resiliently pressed against the stem 24 or against the longitudinal region 33 of the contact member 12, as is also indicated, in dash-dotted lines, in FIG. 3 of the drawing, by way of an example. As a result of this expedient, the electric conductivity of the resilient contact pin 10 is further improved. Of course, the pressing force of the back hook 14' against the stem 24 may here be only so large that the contact member 12 is capable of continuing its axial stroke movements.

In FIG. 2, the free end region of the shank 24 is configured as a contact tip 27'.

Even though it is particularly advantageous when the piston 20 abuts the back hook 14 in the frontmost position of the contact member 12, it can possibly also be provided that the back hook 14 engages a different location of the contact member 12, preferably a recessed portion of the stem 24.

As is shown in dash-dotted lines in FIG. 4 of the drawing, there may be provided more than one tab or back hook 14. To this end, there is provided here an additional U-shaped cutout 30a in the preform 25 at the level of the L-shaped cutout 30, which also delimits a tongue-shaped back hook 14. This additional back hook 14 is located substantially diametrically opposite the rolled tube 9 of the other back hook 14 and is also inwardly bent, so that the piston 20 is retained in its frontward limiting position by means of two abutments 14 which are approximately symmetrical with respect to one another. This does not change anything with respect to the rapid assembly of the resilient contact pin 10.

The abutment interface of the tube 9 extends, because of the rectangular configuration of the preform 25, in the axial direction. However, it is also possible and contemplated here in some instances to bend a preform having the configuration of a parallelogram that is not rectangular to form the tube 9, so that the abutment interface extends along a helical course. Also, if so desired, the longitudinal edges 31 of the preform 25 may be provided with teeth or serrations, so that the abutment interface of the tube 9 then extends along a zig-zag course, and so on.

The presence of the L-shaped cutout 30 in the preform 25 depicted in FIG. 4 of the drawing can often render the bending of the preform 25 into the tube 9 more difficult or more expensive, because of the asymmetry introduced thereby. This is particularly true in view of the very small wall thicknesses of the substantially circularly cylindrical tube 9, that is, the very small thickness of the sheet metal preform 25 which amounts to only 0.08 to 0.2 millimeter, for instance. In some cases, the sheet metal thickness can be even somewhat smaller or somewhat larger. Moreover, the rectangular preform 25, which forms the tube 9 after bending, is relatively long; for instance, its length amounts to 1 to 10 centimeters, preferably to 2 to 6 centimeters.

It is possible to facilitate the bending of the preform 25, which is achieved by rolling or in any other manner, to form the tube 9 which preferably has a round cross section, by using economical tools and without encountering any problems, in that a single straight cutout 30' (FIGS. 5, 7 and 9) is provided instead of the L-shaped cutout 30, or two straight and mutually parallel cutouts 30" (FIGS. 6, 8 and 10) are punched in the rectangular cutout 25 instead of the L-shaped cutut 30 of FIG. 4. These cutouts 30" then form narrow slots in the preform 25, which extend at right angles with respect to the respective longitudinal side 40 of the respective preform 25. The cutout 30' or the cutouts 30" commence at this straight longitudinal side 40 and open thereonto, and it extends or they extend a short distance into the preform 25. Instead of these straight cutouts 30' or 30", there can be used in some cases even cutouts which are not straight, for instance, are slightly arcuate and/or are inclined with respect to the side 40.

The two cutouts 30" in this case have an equal length, but it can also be provided in some cases that they have unequal lengths, as is indicated for the lower cutout 30" by an extension 30b which is drawn in dash-dotted lines.

It is especially advantageous when the cutout 30' commences or the cutouts 30" commence at the respective longitudinal edge 40 of the preform 25 by opening thereonto. After the bending of the preform 25 of FIG. 5 or 6 to the respective tube 9, which can in this case be a tube substantially corresponding to the tube 9 of FIG. 2 (however, the cutouts 30' or 30" can be also situated somewhat higher, as it applies, for example, for the L-shaped cutout of FIG. 4 and thus approximately for the tube 9 according to FIG. 1), a tongue-shaped lug or back hook 14 or 14' is bent in each instance into the tube interior by utilizing the cutout 30' (FIG. 5) or the cutouts 30" (FIG. 6). Preferably, the preform 25 can be of a still soft, plastically bendable sheet metal which obtains its resiliently elastic properties only subsequently only after the bending of the preform 25 to the tube 9 and the formation of the back hooks 14 or 14', by heat treatment or other hardening and/or tempering treatment. Especially when the tube 9 (FIGS. 8 and 10) is formed from the preform 25 shown in FIG. 6, it can also be provided that it is not given any resiliently elastic properties, but rather only a slight elasticity or even no elasticity at all.

The cutout 30' of the preform 25 in accordance with FIG. 5 of the drawing serves the purpose of bending an approximately triangular back hook 14. This triangular back hook 14 is bent either already prior to the bending of the preform 25 to the tube 9, or simultaneously with such bending, or even after the bending of the preform 25 to the tube 9 (FIGS. 7 and 9) in such a manner that it extends with a spiral deformation inclined inwardly into the tube 9. This approximately triangular, arched lug 14 also forms a tongue-shaped resiliently elastic back hook which includes two edges 15 and 15" which still extend at right angles to one another in the preform 25, of which the edge 15 serves as an abutment for the piston section 34' of the piston member 12, as is shown in the exemplary embodiment of FIG. 2 of the drawing. The reduced-diameter stem-shaped intermediate section 33 of the piston 20 that consists of this intermediate section 33 and the two piston section 34 and 34' (of which the piston section 34 is not shown in FIGS. 7 to 10 of the drawing) is pressed with its annular shoulder 21, in its uppermost position into which it is urged by the here not illustrated spring of the resilient contact pin 10, against the lower transverse edge 15 of the resilient back hook 14. This back hook 14 of FIGS. 7 and 9 renders it possible to assemble the respective resilient contact pin 10 in the same manner as described above in conjunction with FIGS. 1 and 2 of the drawing, in that initially the here non-illustrated spring is introduced into the interior of the tube 9 first, followed by the contact member 12 with the piston 20 thereof in a leading position. Herein, the resiliently elastic back hook 14 is bent outwardly by the piston section 34'. Then, as soon as the annular shoulder 21' of this piston section 34' has passed by the back hook 14, the back hook 14 returns into its position which is illustrated in FIGS. 7 and 9 of the drawing and in which it is bent in a deformed fashion into the interior of the tube 9. After that, the lower transverse edge 15 of the tongue-shaped back hook 14 forms an abutment for the annular shoulder or collar 21, and thus defines the upper limiting position of the contact member 12.

The other edge 15" of the back hook 14 (FIGS. 5, 7 and 9) is constituted by a section of the longitudinal edge 40 of the original preform 25. The longitudinal side 40 extends in the axial direction of the tube 9 and is situated in the tube 9 opposite to the other longitudinal side 40' of the original preform 25, without any spacing or at a small spacing while forming an abutment gap or interspace 35.

In some cases, it can also be provided that, for the formation of such an approximately triangular deformed back hook 14, there is not provided only a single straight cutout 30'; rather, an L-shaped 30''' is arranged within the preform 25, as is also indicated in FIG. 5 of the drawing by dash-dotted lines; yet, the single straight cutout 30' is more advantageous for the bending of the tube 9.

The exemplary embodiment which is drawn in solid lines in conjunction with FIGS. 5, 7 and 9 of the drawing and which includes the illustrated cutout 30' of the preform 25 is especially advantageous with respect to the back hook 14 for the exact, simple manufacture of the tube 9 from the respective preform 25.

With respect to the rectangular preform 25 which is illustrated in solid lines in FIG. 6 of the drawing, it is especially contemplated that this sheet metal preform 25 be made of an easily plastically bendable material, such as soft copper-beryllium or the like, which is not subjected after the bending of the preform 25 to the tube 9 (FIGS. 8 and 10) to any treatment for the achievement of resiliently elastic properties for the lug or back hook 14' that is formed by using the cutouts 30'', or for the remainder of the tube 9. For the assembly, the lug 14' is initially not bent after the bending of the tube 9 into the interior of the thus formed tube 9; rather, the non-illustrated spring and the piston 20 of the contact member 12 are first introduced into the interior of the tube 9 which constitutes or substantially constitutes the respective cylinder member 11 of the resilient contact member 10 to be assembled. Only thereafter is the lug 14' bent inwardly (FIGS. 8 and 10) and now constitutes the abutment for determining the frontward limiting position of the contact member 12, in that the annular shoulder 21' of the piston section 34' comes into contact in this limiting position with the lower longitudinal edge 15 of the aforementioned lug 14'. While it is true that, as a result, the assembly of the resilient contact pin 10 of this construction is rendered more expensive by the requisite operation of the inward bending of the lug 14', which operation must be performed only after the insertion of the piston 20, there is still obtained, among others, the advantage that there is no danger of damage and no clamping of the piston 20 can be caused by the lug 14.

There can be also achieved, even when the two cutouts, such as 30'' (FIG. 6) are used, a deformed bending of the lug in the inward direction of the tube 9, preferably in such a manner that the inwardly bent lug 14 also forms a resiliently elastic back hook which renders it possible to introduce contact member 12 into the tube 9 only after the completion of the manufacture of the tube 9, as was explained before in conjunction with the exemplary embodiments illustrated in FIGS. 1, 3, 7 and 9 of the drawing. In this case, however, it is then particularly advantageous to make the cutouts 30'' of different lengths. To this end, the lower cutout 30'' may be made longer by the provision of the dash-dottedly indicated extension 30b thereof than the upper cutout 30'' that extends in parallel therewith. This facilitates the deformation of the lug 14' to a back hook.

It can be also provided in many cases even in the preform 25 according to FIG. 6 that, instead of or in addition to the two cutouts 30'', and preferably at their elevation, there is provided at least one U-shaped cutout 30c within the preform 25. This additional cutout 30c also forms a lug 14' which is bent inwardly after the introduction of the contact member 12 into the tube 9 formed from this preform 25, to provide an abutment for the contact member 12. Generally speaking, however, it is particularly advantageous to let the cutout or cutouts, such as 30' (FIG. 5) or 30'' (FIG. 6) commence in each instance only at the respective longitudinal side 40 and/or 40' of the preform 25, and not to provide any additional cutouts for any additional lugs within the preform 25, since this is especially advantageous for the rolling of the preform 25 to the tube 9.

Figure 11:
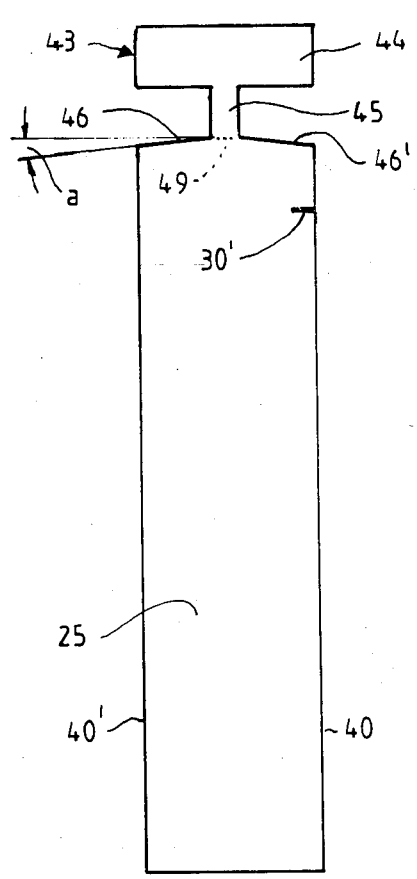
FIG. 11 is a top plan view of a punched-out sheet metal preform for a tube.

In FIG. 11, there is shown in a top plan view a punched-out flat sheet metal member 43. This member 43 may consist of a soft, semi-hard or hard sheet metal material, which may be non-elastic or more or less elastic, and often advantageously resiliently elastic, preferably of brass, nickel brass, nickel-beryllium or copper-beryllium However, even other metals are contemplated for at least some applications.

Figure 12:
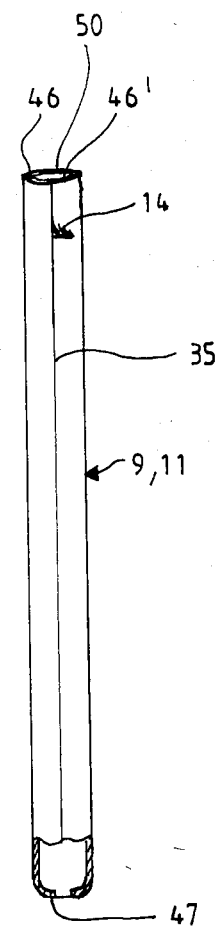
FIG. 12 is a partially sectioned side elevational view of a tube made by bending from the preform of FIG. 11.

This one-piece sheet metal member 43, which has been produced by punching out from a larger sheet metal plate, includes a head 44 which is connected by a narrow connecting strip or web 45 with the preform 25 that is to be bent to form the tube 9 (FIG. 12). This preform 25 which adjoins the web 45 is substantially rectangular; however, its sides 46 and 46' which are located next to the web 45 are arranged at an angle "a" to and mildly inclinedly with respect to a line that extends perpendicularly to the two straight, parallel, elongated longitudinal sides 40 and 40' of the preform 25 which form the abutment gap 35 in the completed tube 9 (FIG. 12). A short straight cutout 30' is punched into the preform 25 at the longitudinal side 40, extending perpendicularly to the longitudinal side 40. The cutout 30' serves for the formation of the resiliently elastic lug or back hook 14 that extends into the interior of the finished tube 9, as was already explained above in connection with the exemplary embodiments according to FIGS. 5 and 7, so that no further explanation is needed here.

The fabrication of the tube 9 by bending from the preform 25 according to FIG. 11 can advantageously be performed in such a manner that this bending about the longitudinal axis of the tube 9 to be fabricated is accomplished in a plurality of consecutive bending steps on the preform 25. Herein, however, only the preform 25 as such is being bent, while the web 45 and the head 44 of the sheet metal member 43 are not being jointly bent. As soon as the bending of the preform 25 to the tube 9 which is initially circularly cylindrical over its entire length except for the back hook that is bent inwardly into the interior of the tube 9 is completed, the tube 9 can be severed from the web 45 by punching along a punching line 49 which is indicated by a dotted line. Thereafter, the non-illustrated spring means, which preferably consists of a single cylindrical helical spring, may advantageously be introduced from below into the interior of the tube 9 which is still fully open at its lower end, and then the lower end region of the tube 9 can be inwardly bent or swagged to form a bottom 47. This bottom 47, however, need not be completely closed, inasmuch as it has to be made by bending merely to such an extent that the spring means can thereafter brace themselves against this bottom 47. Here, the tube 9 by itself constitutes the cylinder member 11. Here again, a connecting contact or conductor can be arranged at the lower end of the cylinder member 11, or an electric connection to a connecting contact or further-leading conductor can be provided only later during or after the incorporation of the resilient contact member 10 into a testing adapter. For completion of the assembly of the resilient contact pin 10 equipped with this tube 9, it is then merely necessary to introduce the here non-illustrated contact member 12, the piston 20 first, from above into the tube 9, with attendant outward bending of the resilient back hook 14, so that the back hook 14, after the piston 20 has been introduced into the interior of the tube 9 to such an extent that or a shoulder thereof it has bypassed the back hook 14, limits the frontward movement of the piston 20 of the contact member 12 in the same manner as described above in conjunction with the other exemplary embodiments.

The inclined end face edge regions 46 and 46' of the tube 9 result in a situation where a frontward end face 50 of the tube 9 which is provided therewith includes a helically ascending end face edge region 46 and an end face edge region 46' which extends in the same circumferential direction as the edge region 46 and descends helically. These two end face edge regions 46 and 46' commence or terminate at the abutment gap or interface 35 and extend, in each instance, over almost 180°, being connected with one another by the preferably straight punching cut 49 that is indicated by the dotted line. These inclined end face edge regions 46 and 46' can be utilized in the event of fully or partially automated production of the respective resilient contact pin 10 for the recognition of the angular position of the tube 9 as well as for the recognition of the frontward end 50 of the tube 9 which is situated adjacent to the back hook 14, in order to bring the tube 9 for the introduction of the contact member 12 or for the bending of the bottom 47 automatically into the correct position for the respective following operating step.

The tube 9 may preferably have the following dimensions: outer diameter of about 0.7 to 2.5 millimeters, length of about 10 to 100 millimeters, sheet metal thickness of about 0.1 to 0.25 millimeter. These dimensions can under certain circumstances be even smaller or larger.

While the present invention has been described and illustrated herein as embodied in some specific constructions of a resilient contact pin for use in a testing adapter, it is not limited to the details of these particular constructions, since various modifications and structural changes are possible and contemplated by the present invention. Thus, the scope of the present invention will be determined exclusively by the appended claims.

What is claimed is:

1. A resilient contact pin for contacting electrical or electronic items to be tested, such as conductor plates, printed circuit boards or the like, the resilient contact pin being electrically conductive and intended for mounting on a testing arrangement, comprising
    a straight cylindrical member including a metallic tube constituted by a punched and bent sheet metal part;
    a contact member including a piston accommodated in said metallic tube for axial sliding and a frontward end portion projecting out of said metallic tube and serving for contacting the item to be tested;
    spring means accommodated in said metallic tube and urging said contact member in a frontward direction relative to said metallic tube; and
    at least one lug constituted by an integral region of a circumferential wall of the metallic tube and extending into the interior of the metallic tube to constitute an abutment which limits the extent of the frontward movement of said piston of said contact member, at least said lug of said tube being resiliently elastic, said lug forming an elastically resilient back hook which is so arranged that it permits the introduction of said piston into said tube with attendant resilient outward bending thereof caused by said piston during said introduction thereof into said tube.

2. The resilient contact pin as defined in claim 1, wherein said lug is tongue-shaped.

3. The resilient contact pin as defined in claim 1, wherein said piston of said contact member has an annular shoulder which is intended for the engagement thereof by said lug in the frontmost position of said contact member.

4. The resilient contact pin as defined in claim 1, wherein said lug is arranged at respective distances from the longitudinal ends of said tube.

5. The resilient contact pin as defined in claim 1, wherein said tube is substantially circularly cylindrical.

6. The resilient contact pin as defined in claim 1, wherein said tube includes only said one lug.

7. The resilient contact pin as defined in claim 1, wherein said tube that includes said lug constitutes said cylinder member by itself.

8. The resilient contact pin as defined in claim 1, wherein said contact member includes a stem that adjoins said piston, and a contact head arranged on said stem; and wherein said lug is situated at the elevation of said stem.

9. The resilient contact pin as defined in claim 1 wherein said lug is bent inwardly into the interior of said tube with a curved generally triangular configuration.

10. The resilient contact pin as defined in claim 1, wherein said contact member includes a stem that adjoins said piston and forms a contact tip; and wherein said lug is situated at the elevation of said stem.

11. The resilient contact pin as defined in claim 10, wherein said lug is resiliently pressed against said stem to improve the electric conductivity of the resilient contact pin.

12. A resilient contact pin for contacting electrical or electronic items to be tested, such as conductor plates, printed circuit boards or the like, the resilient contact pin being electrically conductive and intended for mounting on a testing arrangement, comprising
    a straight cylindrical member including a metallic tube constituted by a punched and bent sheet metal part;
    a contact member including a piston accommodated in said metallic tube for axial sliding and a frontward end portion projecting out of said metallic tube and serving for contacting the item to be tested;
    spring means accommodated in said metallic tube and urging said contact member in a frontward direction relative to said metallic tube; and
    at least one tongue-shaped lug constituted by an integral region of a circumferential wall of the metallic tube and extending into the interior of the metallic tube to constitute an abutment which limits the extent of the frontward movement of said piston of said contact member.

13. The resilient contact pin as defined in claim 12, wherein said piston of said contact member has an annular shoulder which is intended for the engagement thereof by said lug in the frontmost position of said contact member.

14. The resilient contact pin as defined in claim 12, wherein said lug is arranged at respective distances from the longitudinal ends of said tube.

15. The resilient contact pin as defined in claim 12, wherein said tube is substantially circularly cylindrical.

16. The resilient contact pin as defined in claim 12, wherein said tube includes only said one lug.

17. The resilient contact pin as defined in claim 12, wherein said tube that includes said lug constitutes said cylinder member by itself.

18. The resilient contact pin as defined in claim 12, wherein said contact member includes a stem that adjoins said piston, and a contact head arranged on said stem; and wherein said lug is situated at the elevation of said stem.

19. The resilient contact pin as defined in claim 12 wherein said lug is bent inwardly into the interior of said tube with a curved generally triangular configuration.

20. The resilient contact pin as defined in claim 12, wherein said lug is resiliently elastic.

21. The resilient contact pin defined in claim 12 wherein at least said lug of said tube is resiliently elastic.

22. The resilient contact pin as defined in claim 12, wherein said contact member includes a stem that adjoins said piston and forms a contact tip; and wherein said lug is situated at the elevation of said stem.

23. The resilient contact pin as defined in claim 22, wherein said lug is resiliently pressed against said stem to improve the electric conductivity of the resilient contact pin.

24. A resilient contact pin for contacting electrical or electronic items to be tested, such as conductor plates, printed circuit boards or the like, the resilient contact pin being electrically conductive and intended for mounting on a testing arrangement, comprising
a straight cylindrical member including a metallic tube constituted by a punched and bent sheet metal part;
a contact member including a piston accommodated in said metallic tube for axial sliding and a frontward end portion projecting out of said metallic tube and serving for contacting the item to be tested;
spring means accommodated in said metallic tube and urging said contact member in a frontward direction relative to said metallic tube; and
at least one lug constituted by an integral region of a circumferential wall of the metallic tube nd extending into the interior of the metallic tube to constitute an abutment which limits the extent of the frontward movement of said piston of said contact member, said lug including in all two edges which extend at an angle with respect to one another and are produced by punching.

25. The resilient contact pin as defined in claim 24, wherein said piston of said contact member has an annular shoulder which is intended for the engagement thereof by said lug in the frontmost position of said contact member.

26. The resilient contact pin as defined in claim 24, wherein said lug is arranged at respective distances from the longitudinal ends of said tube.

27. The resilient contact pin as defined in claim 24, wherein said tube is substantially circularly cylindrical.

28. The resilient contact pin as defined in claim 24, wherein said tube includes only said one lug.

29. The resilient contact pin as defined in claim 24, wherein said tube that includes said lug constitutes said cylinder member by itself.

30. The resilient contact pin as defined in claim 24, wherein said contact member includes a stem that adjoins said piston, and a contact head arranged on said stem; and wherein said lug is situated at the elevation of said stem.

31. The resilient contact pin defined in claim 24, wherein said lug has a tongue-shaped configuration.

32. The resilient contact pin as defined in claim 24 wherein said lug is bent inwardly into the interior of said tube with a curved generally triangular configuration.

33. The resilient contact pin as defined in claim 24, wherein said contact member includes a stem that adjoins said piston and forms a contact tip; and wherein said lug is situated at the elevation of said stem.

34. The resilient contact pin as defined in claim 33, wherein said lug is resiliently pressed against said stem to improve the electric conductivity of the resilient contact pin.

35. A resilient contact pin for contacting electrical or electronic items to be tested, such as conductor plates, printed circuit boards or the like, the resilient contact pin being electrically conductive and intended for mounting on a testing arrangement, comprising
a straight cylindrical member including a metallic tube constituted by a punched and bent sheet metal part;
a contact member including a piston accommodated in said metallic tube for axial sliding and frontward end portion projecting out of said metallic tube and serving for contacting the item to be tested;
spring means accommodated in said metallic tube and urging said contact member in a frontward direction relative to said metallic tube; and
at least one lug constituted by an integral region of a circumferential wall of the metallic tube and extending into the interior of the metallic tube to constitute an abutment which limits the extent of the frontward movement of said piston of said contact member, said lug including in all three edges which extend at an angle with respect to one another.

36. The resilient contact pin as defined in claim 35, wherein said piston of said contact member has an annular shoulder which is intended for the engagement thereof by said lug in the frontmost position of said contact member.

37. The resilient contact pin as defined in claim 35, wherein said lug is arranged at respective distances from the longitudinal ends of said tube.

38. The resilient contact pin as defined in claim 35, wherein said tube is substantially circularly cylindrical.

39. The resilient contact pin as defined in claim 35, wherein said tube includes only said one lug.

40. The resilient contact pin as defined in claim 35, wherein said tube that includes said lug constitutes said cylinder member by itself.

41. The resilient contact pin as defined in claim 35, wherein said contact member includes a stem that adjoins said piston, and a contact head arranged on said stem; and wherein said lug is situated at the elevation of said stem.

42. The resilient contact pin defined in claim 35, wherein said lug has a tongue-shaped configuration.

43. The resilient contact pin as defined in claim 35, wherein said lug has a tongue-shaped configuration and extends transversely to said tube while being bent inwardly into the interior thereof.

44. The resilient contact pin as defined in claim 35, in which the lug has a tongue-shaped configuration and extends transversely to the circumferential direction of the tube and bent inwardly into the interior of the tube in a direction extending away from said frontward end portion of the tube.

45. The resilient contact pin as defined in claim 1, claim 12, claim 24 or claim 35 wherein at least one edge of said lug is curved.

46. The resilient contact pin as defined in claim 1, claim 12, claim 24, or claim 35 wherein at least one edge of said lug is inclined to the longitudinal dimension of said tube.

47. The resilient contact pin as defined in claim 24 or 35 wherein said angle is a right angle.

48. The resilient contact pin as defined in claim 35, wherein said contact member includes a stem that adjoins said piston and forms a contact tip; and wherein said lug is situated at the elevation of said stem.

49. The resilient contact pin as defined in claim 48, wherein said lug is resiliently pressed against said stem to improve the electric conductivity of the resilient contact pin.

50. A method of manufacturing a cylinder member of a resilient contact pin for use in testing electric or electronic items, such as printed circuit boards, comprising the steps of
   punching a preform from a sheet metal element;
   punching at least one cutout having a shape delimiting a lug into the preform;
   bending the preform to a tube; and
   bending the lug relative to the preform to extend into the interior of the tube.

51. The method as defined in claim 50, and further comprising the step of subjecting the tube at least at the region of the lug to a treatment which imparts resiliently elastic properties at least to the lug.

52. The method as defined in claim 50, wherein said step of punching said preform includes punching said preform from a resiliently elastic sheet metal element.

* * * * *